United States Patent
Chen et al.

[11] Patent Number: 5,899,723
[45] Date of Patent: * May 4, 1999

[54] OBLIQUE IMPLANTATION IN FORMING BASE OF BIPOLAR TRANSISTOR

[75] Inventors: Hung-Sheng Chen; Chih Sieh Teng, both of San Jose, Calif.

[73] Assignee: National Semiconductor Corporation, Santa Clara, Calif.

[*] Notice: This patent is subject to a terminal disclaimer.

[21] Appl. No.: 08/804,311

[22] Filed: Feb. 21, 1997

Related U.S. Application Data

[63] Continuation of application No. 08/320,144, Oct. 7, 1994, Pat. No. 5,605,849.

[51] Int. Cl.⁶ .................................................. H01L 21/331
[52] U.S. Cl. ..................... 438/309; 438/345; 438/350; 438/525
[58] Field of Search ................... 148/DIG. 10; 438/309, 438/316, 345, 350, 369, 525

[56] References Cited

U.S. PATENT DOCUMENTS

| | | | |
|---|---|---|---|
| 3,595,716 | 7/1971 | Kerr et al. | 438/346 |
| 4,441,932 | 4/1984 | Akasaka et al. | 438/345 |
| 4,771,012 | 9/1988 | Yabu et al. | 437/29 |
| 5,183,768 | 2/1993 | Kameyama et al. | 437/26 |
| 5,258,317 | 11/1993 | Lien et al. | 437/32 |
| 5,270,226 | 12/1993 | Hori et al. | 437/35 |
| 5,288,652 | 2/1994 | Wang et al. | 437/31 |
| 5,302,535 | 4/1994 | Imai et al. | 437/31 |
| 5,338,695 | 8/1994 | Ratnam | 437/32 |
| 5,342,794 | 8/1994 | Wei | 437/31 |
| 5,350,700 | 9/1994 | Yang et al. | 437/31 |
| 5,605,849 | 2/1997 | Chen et al. | 437/31 |

FOREIGN PATENT DOCUMENTS

| | | |
|---|---|---|
| 0510374 | 10/1992 | European Pat. Off. . |
| 1-21919 | 1/1989 | Japan . |
| 0082561 | 3/1989 | Japan . |
| 0142732 | 5/1992 | Japan . |
| 5-41385 | 2/1993 | Japan . |
| 5-41387 | 2/1993 | Japan ...................................... 437/35 |
| 5-62986 | 3/1993 | Japan . |
| 5109745 | 4/1993 | Japan . |
| 5109748 | 4/1993 | Japan . |
| 224539 | 6/1994 | Taiwan . |

OTHER PUBLICATIONS

Alvarez, *BiCMOS Technology and Applications* (Kluwer Acad Pub., 2d ed.), 1993, p. 76.

(List continued on next page.)

*Primary Examiner*—Tuan H. Nguyen
*Attorney, Agent, or Firm*—Skjerven, Morrill, MacPherson, Franklin & Friel LLP; Ronald J. Meetin

[57] ABSTRACT

In fabricating a bipolar transistor, semiconductor dopant is introduced into a semiconductor body during a base doping operation to define a doped region, that forms a PN junction with adjoining semiconductor material and abuts a slanted sidewall of a field insulating region. The doped region constitutes a base region for the transistor. The base doping operation entails ion implanting the dopant into the body at a tilt angle of at least 15° relative to the vertical. The minimum lateral base thickness and, the minimum sidewall base thickness increase relative to the minimum vertical base thickness. As a result, the magnitude of the collector-to-emitter breakdown voltage typically increases. The minimum lateral, sidewall, and vertical base thicknesses vary with the tilt angle and base-implant energy in such a manner that the minimum lateral base thickness and the minimum sidewall base thickness are separately controllable from the minimum vertical base thickness.

26 Claims, 8 Drawing Sheets

OTHER PUBLICATIONS

Blauschild, High Voltage Analog Performance with Low–Voltage Digital Devices, *IEEE J. Solid–State Circuits,* vol. SC–13, No. 6, Dec. 1978, pp. 754–759.

Burnett et al, "Bipolar Reliability Optimization through Surface Compensation of the Base Profile," IEEE Int'l Reliability Physics Symp., Mar. 31 –Apr. 2 1992, pp. 107–111.

Havemann et al, "Process Integration Issues for Submicron BiCMOS Technology", *Solid State Technology,* Jun. 1992, pp. 71–76.

Ratnam et al, "The Effect of Isolation Edge Profile on the Leakae and Breakdown Characteristics of Advanced Bipolar Transistors," IEEE Bipolcar Circs. & Tech. Meeting, Oct. 7–8, 1992, pp. 117–120.

Simonton et al, "Channeling Effects in Ion Implantation", SRC Pub C93061, Feb. 1993, pp. 64–84.

Stolfa et al, "A BiCMOS 0.8$\mu$m Process with a Toolkit for Mixed–Mode Design," IEEE Cust. Integ. Circs. Conf., May 9–12, 1993, pp. 24.2.1–24.2.4.

Taft et al, "Optimization of Two–Dimensional Collector Doping Profiles for Submicron BiCMOS Technologies", IEEE Int'l Elec. Devs. Meeting, 1991, pp. 33.6.1–33.6.4.

5,899,723

OBLIQUE IMPLANTATION IN FORMING BASE OF BIPOLAR TRANSISTOR

CROSS REFERENCE TO RELATED APPLICATIONS

This is a continuation of U.S. patent application Ser. No. 08/320,144, filed Oct. 7, 1994, now U.S. Pat. No. 5,605,849.

FIELD OF USE

This invention relates to semiconductor devices. More particularly, this invention relates to methods of fabricating bipolar transistors.

BACKGROUND ART

A bipolar transistor consisting of an emitter, collector, and intervening base is typically created in a vertical arrangement along a major surface of a semiconductor body. Referring to the drawings, FIG. 1 illustrates a conventional vertical NPN transistor of the type described in Stolfa et al, "A BiCMOS 0.8 $\mu$m PROCESS WITH A TOOLKIT FOR MIXED-MODE DESIGN," IEEE Cust. Integ. Circs. Conf., 9–12 May 1993, pp. 24.2.1–24.2.4. The transistor in FIG. 1 is created from a silicon semiconductor body consisting of P− substrate 10 and overlying N epitaxial layer 12. N+ buried layer 14 lies along the metallurgical interface between substrate 10 and epitaxial layer 12. Field-oxide region 16 is partially sunk into the semiconductor body along the upper surface of layer 12.

P base region 18 and N+ emitter region 20 are situated in epitaxial layer 12 with base region 18 abutting field oxide 16. The collector is formed with N+ buried layer 14 and the portion of N epitaxial layer 12 lying below base region 18. Small portions of epitaxial layer 12 situated to the sides of base region 18 also invariably act as part of the collector. Items 22 and 24 in FIG. 1 respectively indicate the collector-base and emitter-base junctions. The transistor further includes P+ base contact zone 26 and N+ collector contact zone 28.

Base region 18 and emitter region 20 are formed by introducing suitable P-type and N-type dopants into epitaxial layer 12 through appropriate parts of its upper surface to respectively define junctions 22 and 24. The P-type doping typically entails (a) ion implanting a boron-containing species into layer 12 using a suitable shield to control where the dopant enters layer 12 and (b) annealing the semiconductor body to active the implanted boron and drive it further into layer 12.

The shield used during the P-type ion implantation, commonly referred to as the "base implant", consists of part of field oxide 16. The base-implant shield often includes photoresist, the location of which is indicated by dotted line 30 in FIG. 1. As schematically illustrated by arrows 32 in FIG. 1, the base implant is performed in a direction perpendicular, or nearly perpendicular, to the upper epitaxial surface. In a typical case, the base implantation is done at a tilt angle of 7° relative to the vertical—i.e., the direction generally perpendicular to the upper epitaxial surface—to reduce undesired channeling along the crystal structure.

During the subsequent anneal, part of the implanted P-type dopant diffuses downward and sideways to establish collector-base junction 22 in FIG. 1. The lateral diffusion rate is slightly less than the vertical diffusion rate.

The prior art transistor of FIG. 1 operates in the following manner. When the base-to-emitter voltage is raised to a suitable value, electrons in emitter region 20 move downward across base region 18 and the underlying part of epitaxial layer 12 to buried layer 14. The electrons then move laterally along buried layer 14 and vertically up collector contact zone 28 to the upper epitaxial surface. Even though the current flow through base region 18 is largely in the vertical direction, some electrons pass laterally through the edges of base region 18. The lateral current flow can significantly affect transistor operation and thus needs to be considered in assessing transistor performance.

An important transistor characteristic is the collector-to-emitter breakdown voltage $BV_{CEO}$ with the base open (unconnected). $BV_{CEO}$ is the approximate value of the collector-to-emitter voltage $V_{CE}$ at which the collector current starts to increase very rapidly with small $V_{CE}$ increases. This can occur by avalanche charge-carrier multiplication or punch-through. At punch-through, the depletion region of the collector-base junction extends to the depletion region of the emitter-base junction. The diffusion-limited quasi-neutral zone normally situated between the two regions is eliminated, thereby allowing the number of charge carriers that pass through the base to increase rapidly in an undesirable manner with increasing $V_{CE}$.

The thickness of base region 18 in the lateral direction for the prior art device of FIG. 1 differs from the base thickness in the vertical direction. In particular, the minimum base thickness $t_{BL}$ in the lateral direction can be greater than or less than the minimum base thickness $t_{BV}$ in the vertical direction. As indicated in FIG. 1, minimum lateral base thickness $t_{BL}$ occurs at the upper semiconductor surface. Minimum vertical base thickness $t_{BV}$ is also approximately the average vertical base thickness. The specific relationship between thicknesses $t_{BL}$ and $t_{BV}$ depends on the mechanics of the base implant and diffusion and on the amount $D_{OS}$ by which the edge of photoresist 30 is offset from the edge of emitter region 20 at the $t_{BL}$ location along the upper semiconductor surface.

If $t_{BL}$ is less than $t_{BV}$ in the transistor of FIG. 1, base region 18 first becomes punched through along its lateral edge at the $t_{BL}$ location. When collector-to-emitter breakdown voltage $BV_{CEO}$ is controlled by punch-through, $BV_{CEO}$ is reduced. Collector-to-emitter leakage current $I_{CEO}$ is increased. Both of these effects are undesirable. In short, the transistor characteristics are significantly degraded when $t_{BL}$ is less than $t_{BV}$.

By setting offset distance $D_{OS}$ at a sufficiently high value, $t_{BL}$ is greater than $t_{BV}$. However, this typically requires that the lateral area occupied by the transistor be increased, an undesirable result. Specifically, base region 18 bulges out laterally a distance $D_{BLG}$ beyond the vertical $t_{BL}$ shadow due to the mechanics of the base implant and diffusion. Bulge distance $D_{BLG}$ is typically large compared to $t_{BL}$. In the illustrated example, $D_{BLG}$ is greater than $t_{BL}$.

If offset $D_{OS}$ is increased by a certain amount so as to make $t_{BL}$ greater than $t_{BV}$, bulge distance $D_{BLG}$ is shifted to the left in FIG. 1 by the same amount, thereby increasing the lateral dimension of base region 18. This necessitates a corresponding increase in the lateral dimension of the transistor if the spacing between base region 18 and collector contact 28 is to be held constant in order to avoid further lateral transistor action. It would be desirable to have a technique for increasing thickness $t_{BL}$ without increasing thickness $t_{BV}$, and preferably capable of setting $t_{BL}$ at a value equal to or greater than $t_{BV}$ without significantly increasing the transistor area.

The problem of excessively small lateral base thickness is also of concern in an oxide-isolated vertical bipolar transistor where the emitter is walled—i.e., part of the emitter contacts the isolation oxide. Ratnam et al, "The effect of Isolation Edge Profile on the Leakage and Breakdown Characteristics of Advanced Bipolar Transistors," IEEE Bipolar Circs. & Tech. Meeting, Oct. 7–8, 1992, pp. 117–120, addresses this matter.

FIG. 2 illustrates a profile of a walled-emitter vertical NPN transistor computer simulated in Ratnam et al. The simulated transistor contains N– collector region 34, P base region 36, and N+ emitter region 38, all consisting of monocrystalline silicon. Regions 34–38 all abut an internal sidewall of field-oxide region 40. N+ emitter region 38 is created in a self-aligned manner by dopant out-diffusion from overlying N+ polysilicon emitter contact 42. Items 44 and 46 are the collector-base and emitter-base junctions.

Field-oxide region 40 in FIG. 2 is in the shape of the well-known "bird's beak" where regions 36 and 38 abut field oxide 40. The bird's beak shape of field oxide 42 causes the minimum thickness $t_{BW}$ of base region 36 along the sidewall of field oxide 40 to be significantly less than the minimum vertical base. thickness $t_{BV}$ in the vertical direction. As discussed in Ratnam et al, this significantly increases leakage current $I_{CEO}$ and reduces breakdown voltage $BV_{CEO}$. Ratnam et al indicate that the problem of $t_{BW}$ being less than $t_{BV}$ can be significantly alleviated by providing the field oxide with a largely vertical sidewall. However, this requires extra processing. Analogous to the transistor of FIG. 1, it would be desirable to have a technique for increasing thickness $t_{BW}$ without having to employ the extra processing needed to eliminate the bird's beak.

GENERAL DISCLOSURE OF THE INVENTION

The present invention utilizes a highly oblique ion implantation in creating the base of a bipolar transistor. The highly oblique implantation enables the minimum lateral thickness $t_{BL}$ of the base to be controlled relative to its minimum vertical thickness $t_{BV}$. When the base abuts a slanted sidewall of an electrically insulating field region, the oblique implantation of the invention also allows the minimum base thickness $t_{BW}$ along the sidewall to be controlled in a similar manner. Thicknesses $t_{BL}$ and $t_{BW}$ both increase relative to thickness $t_{BV}$ as the base implant becomes more oblique.

Importantly, thicknesses $t_{BL}$ and $t_{BW}$ can be increased in the invention without significantly increasing the lateral area-occupied by the transistor. Punch-through at the edge of the base, and the attendant deterioration in transistor characteristics, can readily be avoided without degrading the device packing density. The invention provides a substantial advance over the prior art.

Specifically, in accordance with the invention, semiconductor dopant is introduced into a semiconductor body through part of its upper surface during a base doping operation to define a doped zone that forms a PN junction with adjoining material of the semiconductor body outside the doped zone. A portion of the doped zone constitutes a base region for the transistor. The base doping operation entails ion implanting the dopant into the semiconductor body at a tilt angle of at least 15°, preferably at least 20°, relative to a direction generally perpendicular to the upper semiconductor surface. The semiconductor body is usually annealed subsequent to the implantation step. The anneal activates the dopant and causes it to diffuse to the desired location in the body.

A surface-adjoining second region of opposite conductivity type to the base region is preferably created by introducing a dopant of opposite conductivity type to the base dopant into the semiconductor body through an upper surface portion that partially overlaps with the upper surface portion where the base dopant enters the semiconductor body. This second doping operation, which may be initiated before or after the base doping operation, is performed in such a way that the base region forms a PN junction with the second region and separates the second region from the material of the semiconductor body outside the two regions. The second region is normally an emitter region of the transistor.

Due to the mechanics of the base doping operation, minimum lateral base thickness $t_{BL}$ and, in the case where the base region abuts the slanted sidewall of a field insulating region, minimum sidewall base thickness $t_{BW}$ increase as the tilt angle increases. When the collector-to-emitter breakdown voltage $BV_{CEO}$ is controlled by punch-through along the edge of the base region, the collector-to-emitter voltage must reach a greater magnitude to cause punch-through. Accordingly, the magnitude of breakdown voltage $BV_{CEO}$ is raised. Collector-to-emitter leakage current $I_{CEO}$ decreases.

Furthermore, minimum vertical base thickness $t_{BV}$ decreases as the tilt angle increases. By choosing a suitable high value of the implant angle, $t_{BL}$ and $t_{BW}$ both exceed $t_{BV}$. Punch-through thus does not occur at the edge of the base.

Use of the oblique base implantation of the present invention introduces an important control mechanism into the transistor fabrication process. The way in which $t_{BL}$ and $t_{BW}$ vary as a function of the tilt angle differs materially from the way in which $t_{BL}$ varies as a function of the tilt angle. In particular, $t_{BL}$ and $t_{BW}$ generally increase with increasing tilt angle, whereas $t_{BV}$ generally decreases with increasing tilt angle. Adjusting the values of the tilt angle and the implant energy during the base implant thereby enables $t_{BL}$ and $t_{BV}$ to be separately controlled from $t_{BV}$. This provides an additional degree of freedom in optimizing dynamic transistor performance. For example, more latitude is available to enhance the transistor current gain. In short, the invention is highly advantageous.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 3A:
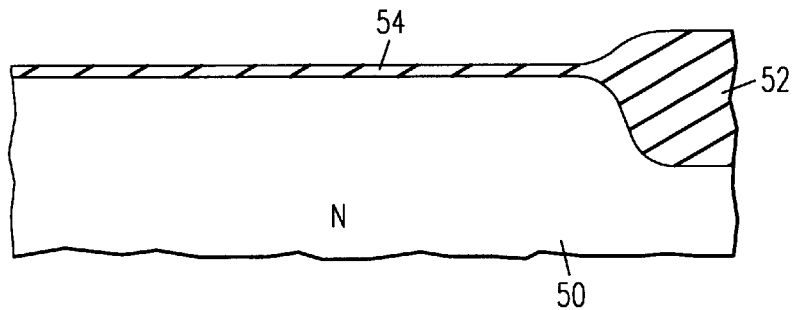
FIGS. 3a, 3b, 3c, and 3d are cross-sectional views illustrating steps in fabricating a vertical bipolar transistor in accordance with the invention.

FIGS. 3a–3d (collectively "FIG. 3") illustrate generally how a vertical NPN bipolar transistor is fabricated using highly oblique base implantation in accordance with the invention to control the base dimensions. The starting point is a monocrystalline semiconductor body having a major N-type region 50 as shown in FIG. 3a. The semiconductor body typically consists of silicon but could be formed with other semiconductors such as germanium or gallium arsenide. The net dopant concentration in major region 50 can be at a moderate level, as indicated by the use of "N" in FIG. 3a, or at a light level. Region 50 may include one or more heavily doped N-type zones (not shown).

An electrically insulating field region 52 is provided along the upper surface of major region 50 according to a conventional technique. Field-insulating region 52 is partially sunk into major region 50. Although not fully shown in FIG. 3a, field-insulating region 52 fully laterally surrounds an upper portion of major region 52. Field region 52 has a slanted internal sidewall as indicated in FIG. 3a.

For exemplary purposes, the height to which field-insulating region 52 extends above the upper surface of major region 50 is illustrated as being significantly less than the depth to which field region 52 extends into region 50. Nonetheless, the upper surface of region 52 could be considerably higher or lower than depicted in FIG. 3a. When major region 50 consists of silicon, field region 52 typically consists principally of silicon oxide.

A thin protective layer 54 is optionally provided along the portion of the upper semiconductor surface surrounded by field-insulating region 52. Protective layer 54 is typically formed with an electrical insulator but could consist of metal or semiconductor material on an electrical insulator. When major region 50 consists of silicon, protective layer 54 is typically thermally grown silicon oxide.

A patterned layer 56 of photoresist is provided along the upper surface of the structure according to a conventional technique. See FIG. 3b. Photoresist layer 56 has an opening situated over part of the semiconductor material laterally surrounded by field-insulating region 52. The combination of photoresist 56 and the portion of field region 52 not covered by photoresist 56 constitutes a composite base implant shield.

Figure 3B:
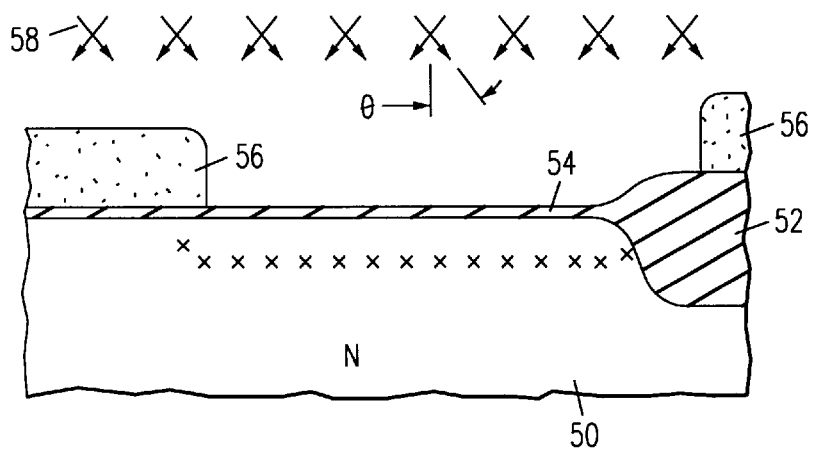

Fabrication of the transistor's base is initiated by ion implanting a P-type semiconductor dopant through the opening in the composite base implant shield into the underlying semiconductor material. When protective layer 54 is present, the P-type dopant passes through the uncovered part of layer 54. Arrows 58 in FIG. 3b represent the implantation step. Except for small, but very important, areas along the edges of the composite implant shield, the implant shield prevents the P-type dopant from entering the semiconductor material vertically covered by the shield.

The implanted P-type dopant is generally distributed vertically in a Gaussian manner in the semiconductor material dependent on the implantation energy and dosage. The small "xs" in FIG. 3b indicate the location of the peak concentration of the implanted dopant. The P-type dopant is typically boron provided in the form of boron or boron difluoride when major region 50 is silicon.

The P-type base implant is performed at a tilt angle $\theta$ relative to the vertical—i.e., the direction generally perpendicular to the upper semiconductor surface. Tilt angle $\theta$ is at least 15° and preferably at least 20°, during the base implant.

As discussed below, base-implant tilt angle $\theta$ is typically 40–50° or more. Thus, the base implant is highly oblique relative to the upper surface of region 50.

Figure 9:
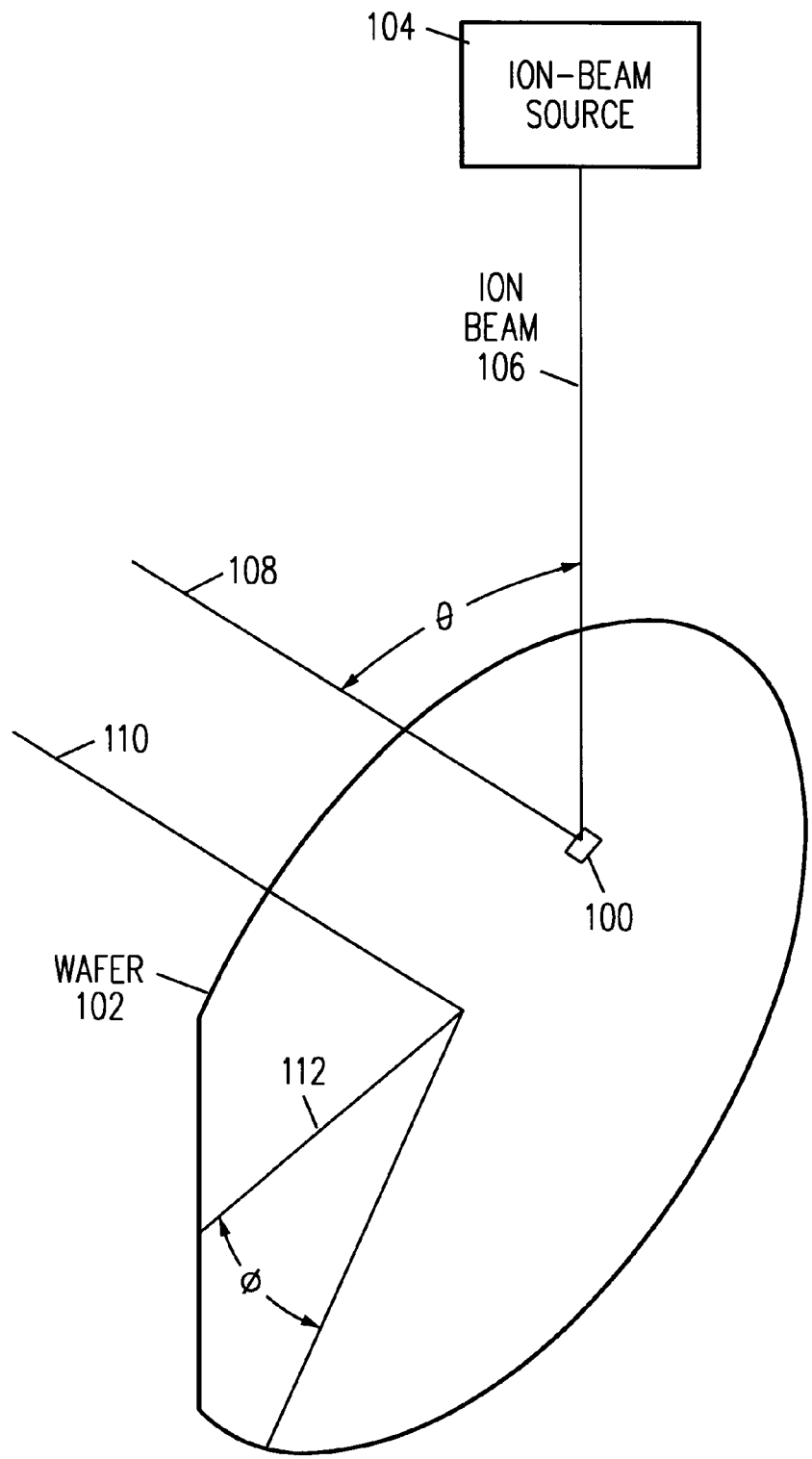
FIG. 9 is a simplified diagram of a wafer in an ion implantation system.

The base implant is done with an ion implantation apparatus having an ion source that provides a beam of ions in a given direction. Tilt angle $\theta$ is rotated in a prescribed manner, typically at a constant rotation rate, about a perpendicular to the upper semiconductor surface. This usually involves rotating the structure of FIG. 3b but can be done by moving the source of the ion beam through an appropriate path. The three-dimensional geometry for the rotation of tilt angle $\theta$ is illustrated in FIG. 9 discussed below.

During the base implant, the ion beam is two-dimensionally scanned in a relatively uniform manner across the upper surface of the transistor structure so that the implant dosage is relatively constant across the implanted region. The two-dimensional scanning is performed according to any of a number of conventional techniques. For example, the structure of FIG. 3b can be moved while the ion beam is fixed. Alternatively, the ion beam can be deflected or the source of the ion beam moved. Even further, both the ion beam and the structure of FIG. 3b can be moved.

Due to the oblique nature of the base implant, a significant amount of the implanted P-type dopant enters small portions of the semiconductor material covered by the implant shield. This part of the dopant is represented by the small "x" at the left and the small "x" at-the right in FIG. 3b. These two "xs" are raised slightly compared to the other "xs" to indicate that the location of the maximum concentration of the implanted dopant in the edge regions below the implant shield bends upward as a result of the oblique implantation mechanics.

Figure 3C:
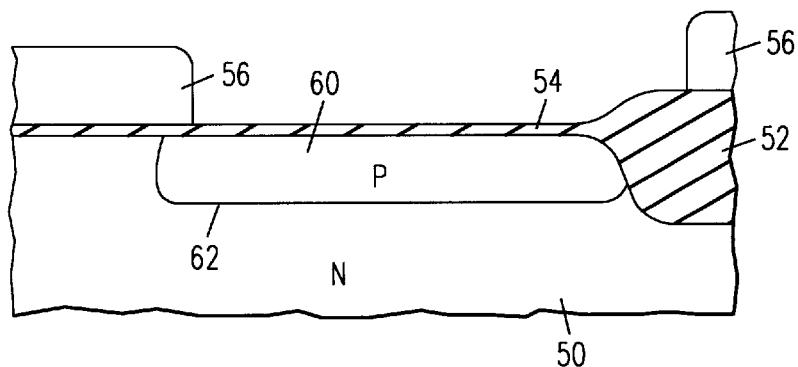

At some point after removing photoresist 56, the structure is annealed to activate the implanted P-type dopant and repair lattice damage. During the anneal, part of the implanted dopant diffuses downward and sideways to form a base precursor zone. The base anneal can be performed directly after the base implant. This case is illustrated in FIG. 3c where item 60 is the base precursor zone. Item 62 in FIG. 3c is the collector-base PN junction. For illustrative purposes, the location of the now-removed patterned photoresist 56 is indicated in dotted lines. Due to the oblique implantation, part of base precursor zone 60 lies below both the location of now-removed photoresist 56 and below the slanted sidewall of field-insulating region 52.

Alternatively, the base anneal can be performed at a later point in the transistor fabrication process. For example, the base anneal can be combined with the emitter anneal described below.

Figure 3D:
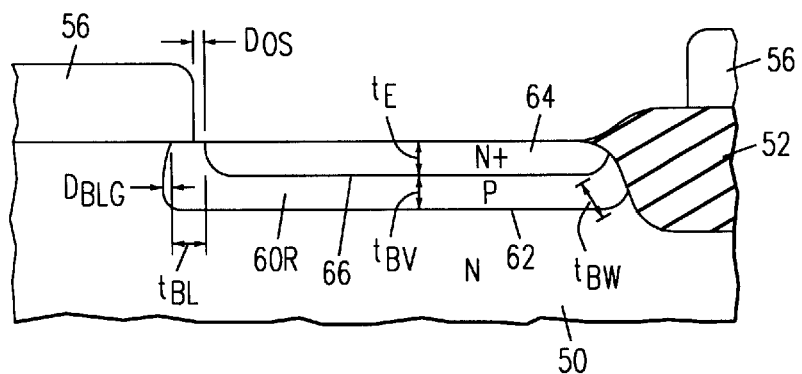

An N-type semiconductor dopant is introduced into a surface-adjoining part of P base precursor zone 60 through a portion of the upper surface area not covered by the composite implantation shield during the base doping operation. In other words, the N-type dopant passes through an upper semiconductor surface portion that partially overlaps with the upper semiconductor surface portion through which the P-type base dopant is ion implanted. The N-type dopant forms a heavily doped N-type emitter region 64 along the upper semiconductor surface as depicted in FIG. 3d. When major region 50 is silicon, the N-type dopant is typically arsenic or phosphorus. Item 66 in FIG. 3d indicates the emitter-base PN junction.

Any of a number of techniques can specifically be used to form N+ emitter region 64. For example, emitter region 64 can be created by (a) selective ion implantation followed by an anneal to activate the implanted dopant and cause it to diffuse downward and sideways, (b) diffusion from a polysilicon emitter contact, or (c) diffusion from a gaseous form of the N-type dopant. Although part of emitter region 64 abuts field-insulating region 52 in FIG. 3d, emitter region 64 could alternatively be formed in a non-walled manner. Depending on how emitter region 64 is formed, protective layer 54 may stay in place, be fully removed, or be replaced with another protective layer. FIG. 3d illustrates an example in which protective layer 54 is removed.

The remaining P-type portion 60R of base precursor zone 60 constitutes at least part of the transistor's base. During the formation of emitter region 64, P base region 60R may expand somewhat in size. In this regard, any high-temperature operations performed during the emitter doping may constitute part or, as indicated above, all of the base anneal. Furthermore, instead of performing the base implantation before the emitter doping, the base implantation and anneal can be performed after the emitter doping. In each case, the net result is the structure of FIG. 3d.

P+ base region 60R connects through a heavily doped P-type base contact zone (situated outside the plane of FIG. 3d and thus not shown in FIG. 3d) to an overlying external base contact (also not shown) formed atop the upper semiconductor surface. The portion of major region 50 underlying base region 60R constitutes at least part of the transistor's collector. In a typical configuration, the collector extends laterally beyond base region 60R and connects through a heavily doped N-type collector contact zone (not shown) to an overlying external collector contact (also not shown) provided atop the upper semiconductor surface. Alternatively, an external contact to the collector could be furnished from the bottom of the structure. An external emitter contact (not shown) overlies emitter region 64.

The non-walled lateral edge of N+ emitter region 64 is offset from the location of the edge of photoresist layer 56 by an amount $D_{OS}$. In the illustrated example, the location of photoresist 56 is situated to the left of emitter region 64. Nonetheless, the location of photoresist 56 could partially overlie region 64, thereby causing offset distance $D_{os}$ to effectively have a negative value.

Items $t_{BV}$, $t_{BL}$, and $t_{BW}$ in FIG. 3d respectively represent the minimum vertical thickness of base region 60R, the minimum lateral base thickness at the non-walled edge of emitter region 64, and the minimum base thickness along the sloped sidewall of field-insulating region 52. Minimum vertical base thickness $t_{BV}$ is approximately the average vertical thickness of base region 60R. Minimum lateral base thickness $t_{BL}$ occurs along the upper semiconductor surface. Item $t_E$ in FIG. 3d is the (vertical) thickness of emitter 64.

Thicknesses $t_{BV}$, $t_{BL}$, and $t_{BW}$ vary with base-implant tilt angle θ in such a way that thicknesses $t_{BL}$ and $t_{BW}$ both increase with increasing θ while thickness $t_{BV}$ decreases with increasing θ. If $t_{BV}$ is held at a constant value, $t_{BL}$ and $t_{BW}$ are thereby increased by increasing tilt angle θ. When collector-to-emitter breakdown voltage $BV_{CEO}$ is controlled by punch-through at the edge of base region 60R along the upper semiconductor surface or along the sidewall of field-insulating region 52, setting tilt angle at 15° or more, preferably at least 20°, causes the magnitude of breakdown voltage $BV_{CEO}$ to be greater than what would occur if tilt angle θ were less than 15°. Collector-to-emitter leakage current ICEO is reduced.

When offset $D_{OS}$ and emitter thickness $t_E$ have suitable values, thicknesses $t_{BL}$ and $t_{BW}$ can be set at values greater than or equal to $t_{BV}$ by utilizing a suitably high value of tilt angle θ in the range between 15° and a maximum implant angle $θ_{MAX}$ slightly less than 90°. This substantially avoids punch-through at the edge of base region 62R. Breakdown voltage $BV_{CEO}$ then depends on thickness $t_{BV}$, rather than thickness $t_{BL}$ and/or thickness $t_{BW}$. The same applies to leakage current $I_{CEO}$.

Figure 4:
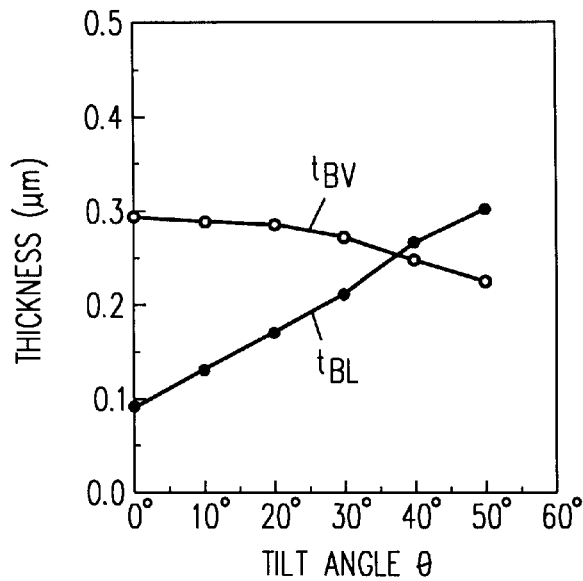
FIG. 4 is a graph of thicknesses $t_{BL}$ and $t_{BV}$ as a functional of the base-implant tilt angle for simulated bipolar transistors.
Figure 5:
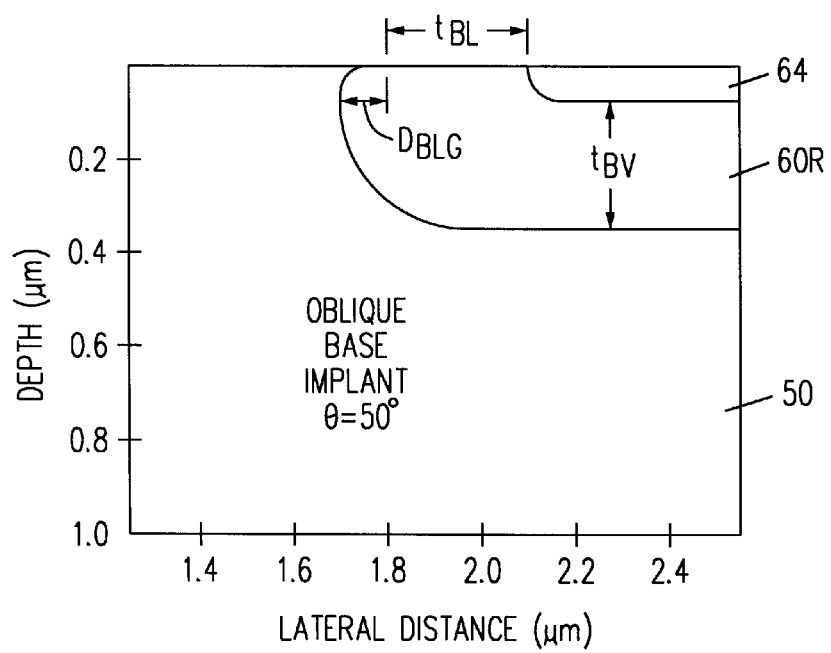
FIG. 5 is a profile of a simulated bipolar transistor fabricated with a highly oblique base implant in accordance with the invention.
Figure 6:
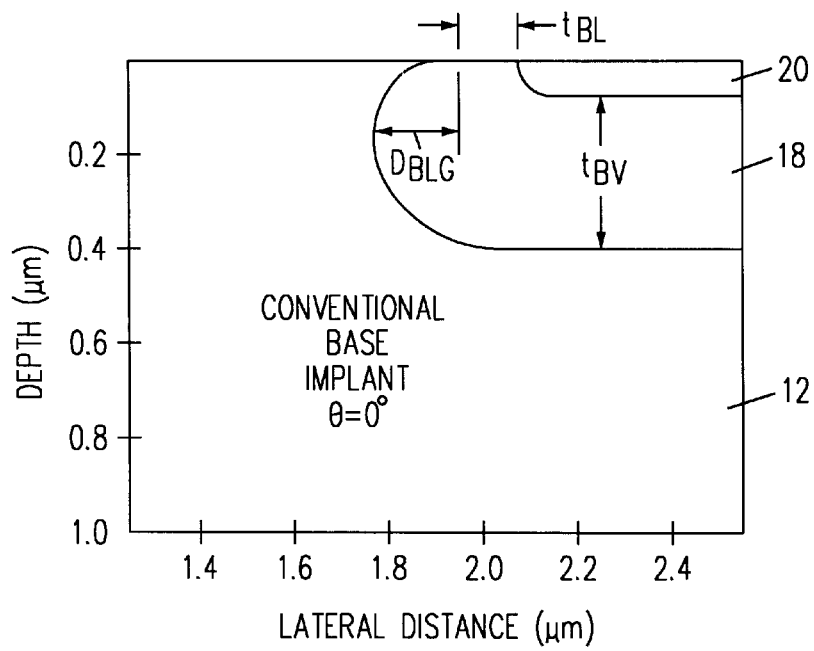
FIG. 6 is a profile of a simulated baseline bipolar transistor fabricated with a conventional base implant.

Consider the relationship between thicknesses $t_{BL}$ and $t_{BV}$ in more detail. FIG. 4 illustrates a computer simulation for thicknesses $t_{BL}$ and $t_{BV}$ as a function of tilt angle θ. In this simulation, offset distance $D_{OS}$ is 0.12 μm, and emitter thickness $t_E$ is 0.07 μm. FIG. 5 depicts a partial profile of the vertical NPN transistor simulated in FIG. 4 when tilt angle θ is set at 50° in accordance with the invention. FIG. 6 depicts a partial profile of a simulated baseline NPN transistor identical to the transistor simulated in FIG. 5 except that tilt angle θ is 0°. In essence, FIG. 6 is a computer simulation of a prior art transistor such as that shown in FIG. 1. For this reasons, the transistor in FIG. 6 is labeled with the reference symbols utilized in FIG. 1.

Figure 1:
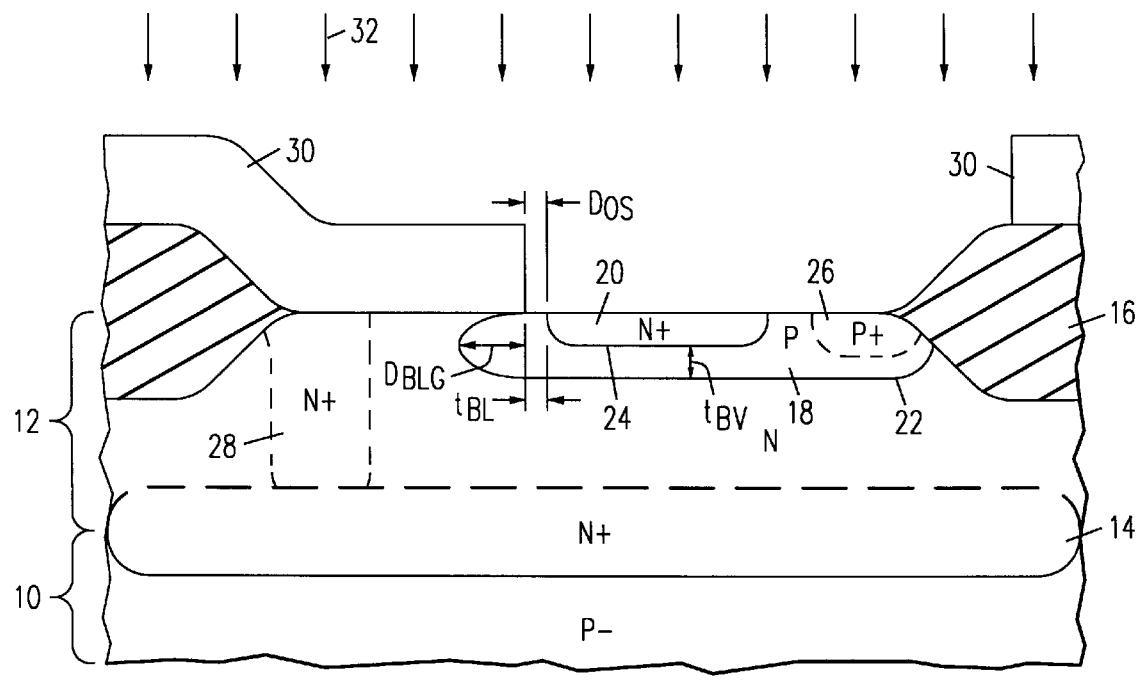
FIGS. 1 and 2 are cross-sectional views of conventional vertical bipolar transistors.
Figure 2:
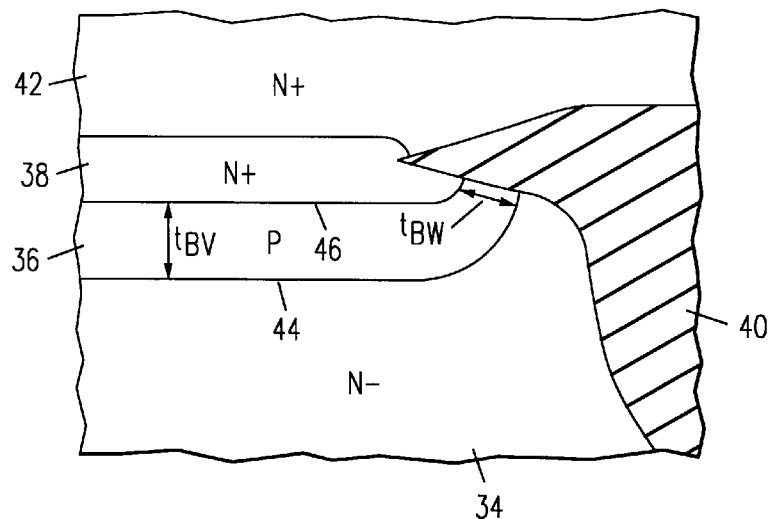

As with P base region 18 in the conventional transistor of FIGS. 1 and 6, P base region 60R in the transistor of FIGS. 3d and 5 bulges out a distance $D_{BLG}$ beyond the $t_{BL}$ location due to the mechanics of the base implant and diffusion. However, the highly oblique base implantation utilized in creating the transistors of FIGS. 3d and 5 causes distance $D_{BLG}$ to be considerably less, and minimum lateral base thickness $t_{BL}$ to be considerably more, than in the transistor of FIGS. 1 and 6. That is, thickness $t_{BL}$ is a considerably larger fraction of the total emitter-base lateral distance $D_{BLG}+t_{BL}$ in the transistor of the invention than in the prior art transistor. The invention makes considerably more efficient usage of total emitter-base distance $D_{BLG}+t_{BL}$ than in the prior art.

Emitter-base distance $D_{BLG}+t_{BL}$ in the simulation of FIG. 5 is approximately 0.1 μm greater than in the simulation of FIG. 6. However, the parameter values in the simulation of FIG. 5 could be adjusted so that distance $D_{BLG}+t_{BL}$ is approximately the same in both simulations without significantly changing the value of offset $D_{OS}$ or the lateral dimensions of the base. Both transistors would then occupy approximately equal lateral areas. But, $t_{BL}$ would exceed $t_{BV}$ in the transistor manufactured according to the invention so as to avoid punch-through at the edge of base region 60R. The invention thus allows minimum lateral base thickness $t_{BL}$ to be increased to a value sufficient to avoid punch-through at the edge of base region 60R without increasing the area occupied by the transistor.

To a rough approximation, minimum vertical base thickness $t_{BV}$ varies linearly with the cosine of tilt angle θ. Similarly, minimum lateral base thickness $t_{BL}$ varies linearly with the sine of tilt angle θ to a rough first approximation. That is:

$$t_{BV} \approx R_V \cos\theta - t_E \quad (1)$$

$$t_{BL} \approx R_L \sin\theta + D_{OS} \quad (2)$$

where parameters $R_V$ and $R_L$ depend on the implant energy and dosage. Parameters $R_V$ and $R_L$ are typically approximately equal.

Eqs. 1 and 2 show that minimum lateral base thickness $t_{BL}$ increases with increasing tilt angle θ whereas minimum vertical base thickness $t_{BV}$ decreases with increasing θ. Inasmuch as parameters $R_V$ and $R_L$ depend on the implant energy during the base implant, $t_{BL}$ can be separately controlled from $t_{BV}$ by adjusting the values of tilt angle θ and the base-implant energy. The same applies to minimum sidewall base thickness $t_{BW}$. Because $t_{BW}$ increases with increasing θ while $t_{BV}$ decreases with increasing θ, adjusting θ and the base-implant energy enables $t_{BW}$ to be separately controlled from $t_{BV}$. Additional freedom is thereby provided in optimizing the current gain and other transistor performance parameters.

FIGS. 7a–7e (collectively "FIG. 7") illustrate a more detailed implementation of the basic process of FIG. 3. In the implementation of FIG. 7, the semiconductor body consists of a lightly doped P-type monocrystalline silicon substrate 70 and an overlying lightly doped N-type epitaxial silicon layer 72. See FIG. 7a. A heavily doped N-type buried collector layer 74 is situated along the metallurgical interface between P– substrate 70 and N– epitaxial layer 72. Major region 50 in FIG. 3a is formed with N– epitaxial layer 72 and N+ buried layer 74 in FIG. 7a. Layers 72 and 74 are created according to conventional techniques.

Figure 7A:
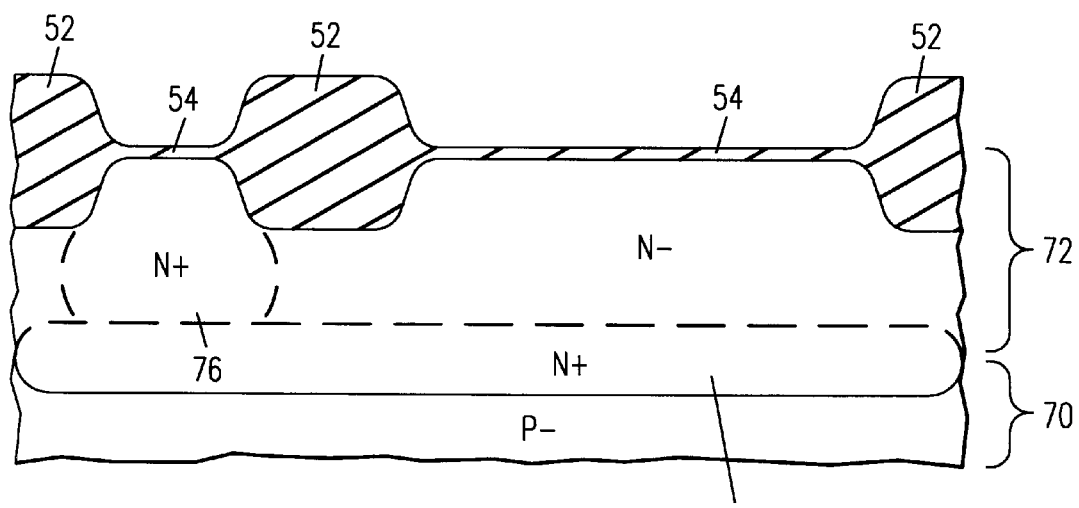
FIGS. 7a, 7b, 7c, 7d, and 7e are cross-sectional views of a detailed implementation of the inventive process of FIGS. 3a–3c.

Field-insulating region 52 laterally surrounds a number of device portions of epitaxial layer 72. Two such epitaxial device portions are shown in FIG. 7a. A heavily doped N-type collector contact zone 76 extends through the left-hand epitaxial device portion down to buried layer 74. N+ collector zone 76 is formed according to a conventional technique. The height of field region 52 above the upper epitaxial surface is approximately the same as the depth of field region 52 into epitaxial layer 72.

Figure 7B:
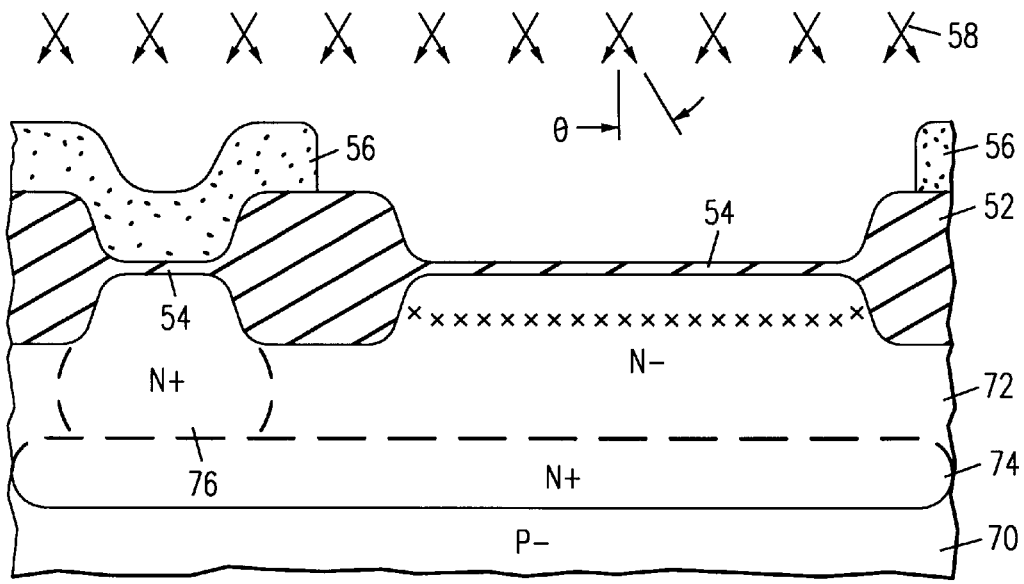

Photoresist layer 56 is provided along the upper surface of the structure as shown in FIG. 7b. In this example, photoresist 56 fully overlies the left-hand epitaxial device portion (which forms collector contact zone 76) but does not extend over any part of the right-hand epitaxial device portion.

The base implant at a value of tilt angle θ equal to at least 15°, preferably at least 20°, is then performed in the manner described above. The implant is typically done with boron at a dosage of 8E13 ions/cm³ and an energy of 80 KeV.

Figure 7C:
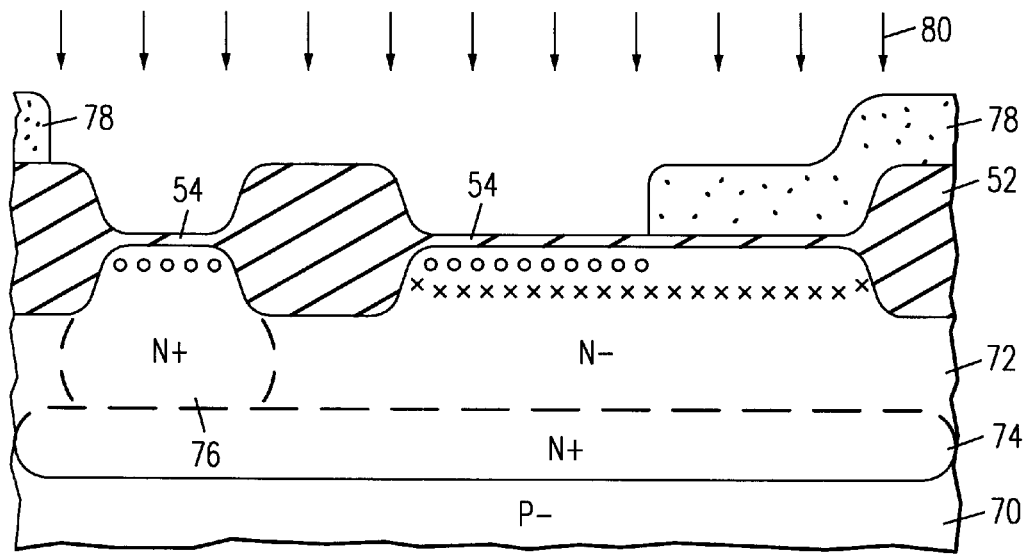

A patterned layer 78 of photoresist is provided on top of the structure as shown in FIG. 7c. Photoresist layer 78 has an opening over the left-hand part of the right-hand epitaxial device portion. The opening may optionally extend over the left-hand epitaxial device portion as indicated in FIG. 7c.

Using photoresist 78 and field-insulating region 52 as a composite emitter implantation mask, an N-type dopant is ion implanted through protective layer 54 into the portion of P region 60 not covered by photoresist 78. Arrows 80 in FIG. 7c represent the N-type implant. The small circles in FIG. 7c indicate the location of the mean depth of the implanted N-type dopant. When the mask opening extends over the left-hand epitaxial device portion, the N-type dopant is also implanted into collector contact zone 76. The N-type implant is typically done with arsenic at a dosage of 3E15 ions/cm³ and an energy of 30 KeV.

Figure 7D:
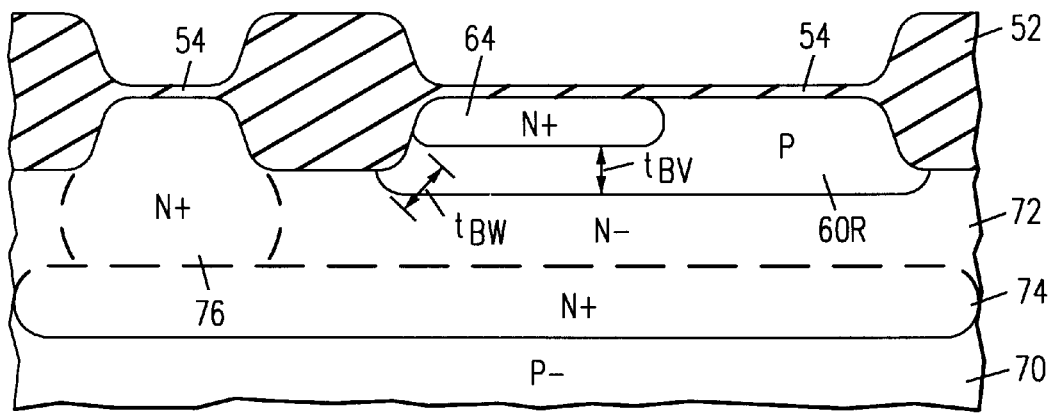

The structure is annealed to activate the implanted P-type and N-type dopants. Parts of the implanted dopants diffuse downward and sideways to form P base 60R and N+ emitter 64. FIG. 7d shows the structure at this point. P base region 60R extends slightly deeper into epitaxial layer 72 than field-insulating region 52. Due to the oblique base implant, $t_{BW}$ is greater than $t_{BV}$. The anneal is typically performed for 15 minutes at 1000° C.

Figure 7E:
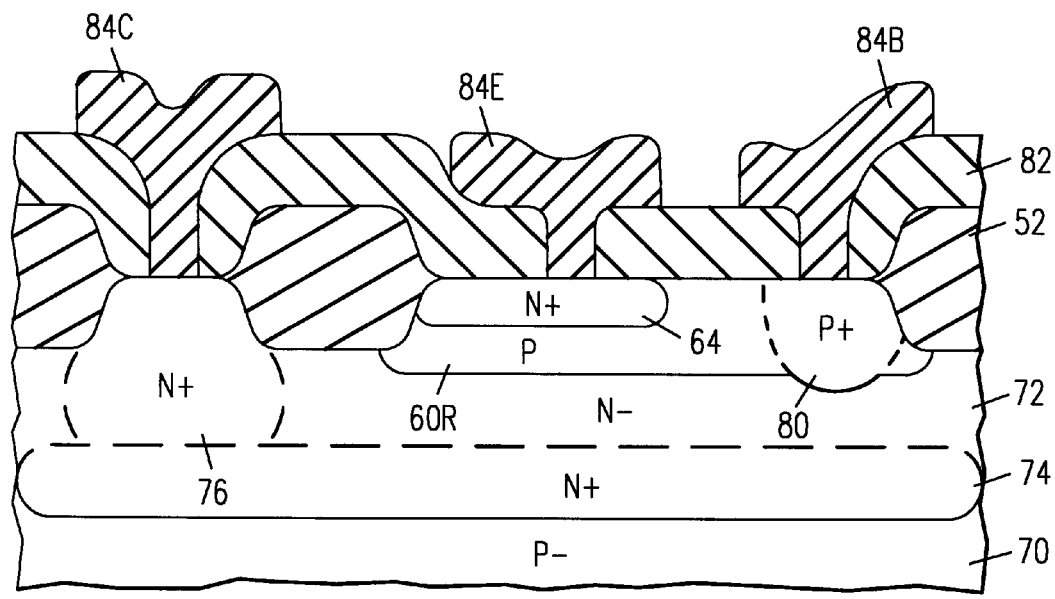

At some point after the formation of field-insulating region 52, a heavily doped P-type base contact zone 80 is created in the right-hand active epitaxial portion at a location spaced apart from the location for emitter region 64. P+ base contact zone 80 is formed according to a conventional technique. A relatively thick layer 82 of electrically insulating material is provided along the top of the structure as shown in FIG. 7e. Unless protective layer 54 is removed, insulating layer 82 includes layer 54.

Using a suitable photoresist mask, openings are etched through insulating layer 82 down to emitter region 64, base contact zone 80, and collector contact zone 76. Metallic contacts 84E, 84B, and 84C are provided respectively to regions 64, 80, and 76 by depositing a metallic layer on top of the structure and patterning the metallic layer using another photoresist mask. Prior to the metal deposition, thin metal silicide portions can be formed along the tops of regions 64, 80, and 76. The fabrication of the transistor in FIG. 7e is completed by depositing an appropriate passivating layer (not shown) on top of the structure and then etching pad openings through the passivating layer.

Figure 8A:
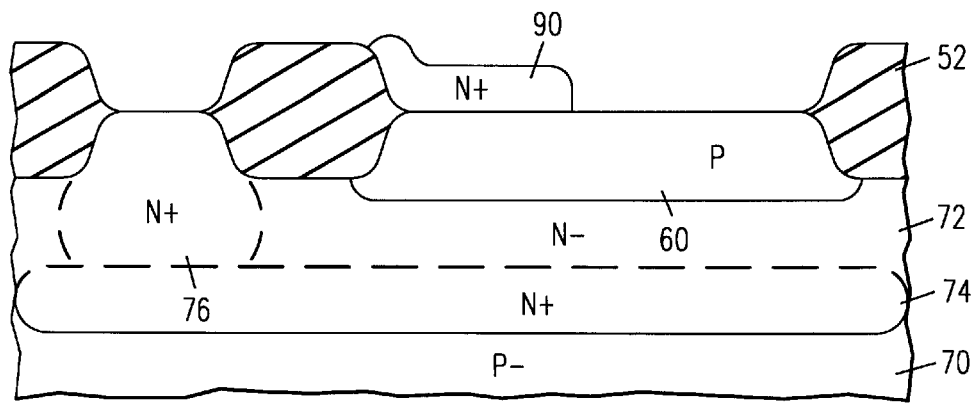
FIGS. 8a, 8b, 8c are cross-sectional views representing steps that can be substituted for the steps shown in FIGS. 7c–7e.
Figure 8B:
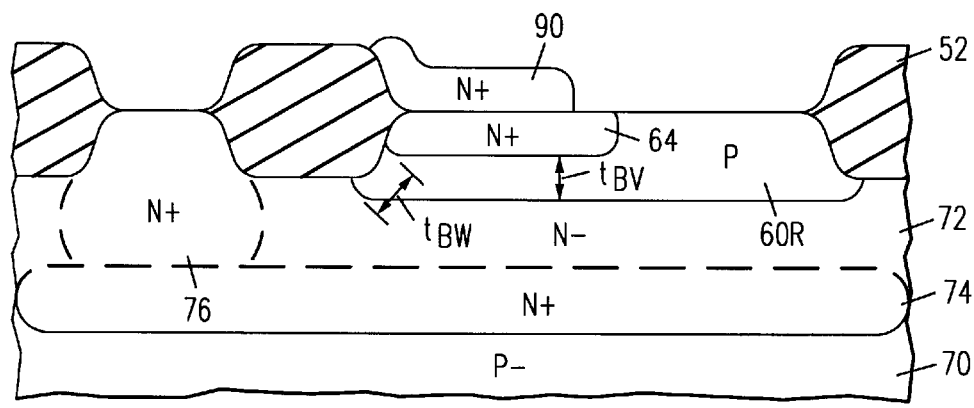
Figure 8C:
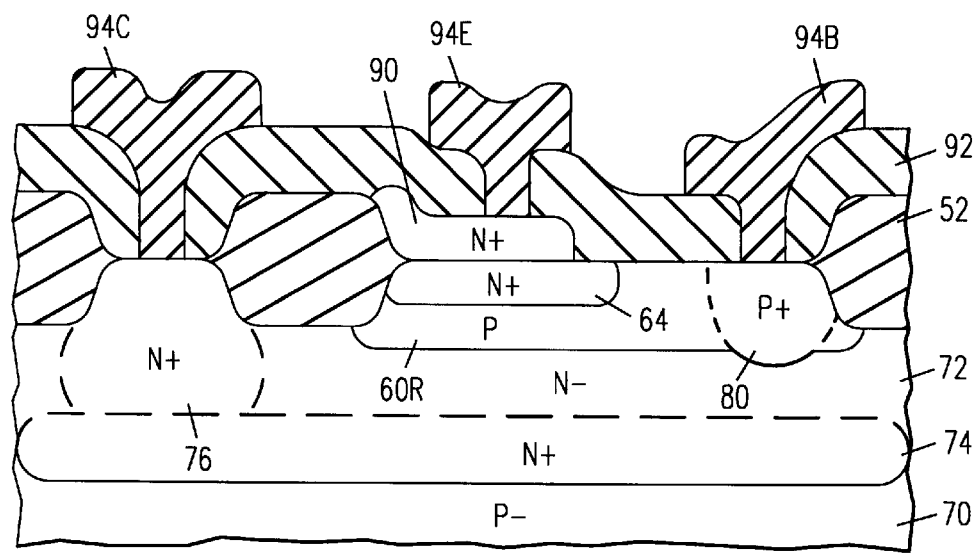

FIGS. 8a–8c (collectively "FIG. 8") depict an alternative way of completing the fabrication of a vertical NPN transistor in accordance with the invention starting at the stage shown in FIG. 7b. In this alternative fabrication process, the structure of FIG. 7b is annealed to create P precursor base region 60. See FIG. 8a.

Protective layer 54 is substantially removed using a suitable etchant. A layer of polysilicon is deposited on top of the structure, doped with a suitable N-type dopant, and etched using a suitable photoresist mask to create a heavily doped N-type polysilicon emitter contact 90 that overlies part of the right-hand active epitaxial portion and extends to its left-hand edge.

The structure is subjected to a heat treatment that causes part of the N-type dopant to diffuse out of polysilicon N+ emitter contact 90 and into the underlying part of P region 60. N+ emitter region 64 is thereby formed in a self-aligned manner to polysilicon emitter contact 90 as shown in FIG. 8b. As a result of the highly oblique base implantation, $t_{BW}$ again exceeds $t_{BV}$.

As in the process of FIG. 7, P+ base contact zone 80 is formed at some point after the creation of field-insulating region 52. A relatively thick layer 92 of electrically insulating material is deposited on top of the structure. Metallic contacts 94E, 94B, and 94C are then provided to contact emitter contact 90, base contact zone 80, and collector contact zone 76 in the same way that metallic contacts 84E, 84B, and 84C are formed in the previous version of the fabrication process. FIG. 8c illustrates the resulting structure. Deposition of a passivating layer and etching of pad openings is performed to complete the transistor fabrication.

FIG. 9 illustrates how the base implant is performed at rotating tilt angle θ. The bipolar transistor being implanted according to the invention is part of a semiconductor die 100 that forms part of a semiconductor wafer 102. An ion-beam source 104 provides an ion beam 106 at tilt angle θ to a perpendicular 108 to the upper surface of wafer 102. During the base implant, wafer 102 is rotated about a perpendicular 110 to the upper wafer surface. The amount of rotation is measured counterclockwise by a twist angle φ defined relative to a selected radius 112 of wafer 102. The rotation rate thus is dφ/dt.

While the invention has been described with reference to particular embodiments, this description is solely for the purpose of illustration and is not to be construed as limiting the scope of the invention claimed below. For example, semiconductor materials of opposite conductivity type to those described above may be utilized to achieve similar results. A vertical PNP transistor can thus be fabricated so that $t_{BV}$ is less then $t_{BL}$ and/or $t_{BW}$.

During the base implant, tilt angle θ could be varied across a small angular range rather than being held constant. Instead of varying twist angle φ at a constant rate to achieve a constant rotation for tilt angle θ, twist angle φ could be set at one or more fixed values, especially in fabricating bipolar transistors where semiconductor regions are laid out in lines running parallel and perpendicular to one another. For instance, arrows 58 in FIG. 3b could represent two fixed values of twist angle φ differing by 180°. Ions would typically be implanted at the two-φ values for equal time periods. More generally, the base implant could be done for selected, typically equal, time periods at 2n values of twist angle φ differing by 180°/n where n is a positive integer.

Field insulation region 52 could extend all the way down to N+ buried region 74. Various modifications and applications may thus be made by those skilled in the art without departing from the true scope and spirit of the invention as defined in the appended claims.

We claim:

1. A transistor fabrication method comprising the steps of:
   introducing semiconductor dopant into a semiconductor body through part of its upper surface to define a doped zone that (1) forms a PN junction with adjoining material of the semiconductor body outside the doped zone and (2) abuts a slanted wall of an electrically insulating field region at least partially sunk into the semiconductor body along its upper surface, a portion of the doped zone constituting a base region for a bipolar transistor, the introducing step entailing ion implanting the dopant into the semiconductor body at a tilt angle of at least 15° relative to a direction generally perpendicular to the semiconductor body's upper surface using a shield to control where the dopant enters the semiconductor body; and
   providing an emitter region for the transistor in material of the semiconductor body situated above part of the base region.

2. A method as in claim 1 wherein the introducing step includes annealing the body subsequent to ion implanting the dopant.

3. A method as in claim 1 wherein the tilt angle is at least 20°.

4. A method as in claim 1 wherein, for a given value of the minimum thickness of the base region in a direction generally perpendicular to the semiconductor body's upper surface, the minimum thickness of the base region along the semiconductor body's upper surface is greater than what would occur with the tilt angle at less than 15° during the introducing step.

5. A method as in claim 1 wherein:
   the base region abuts the slanted wall of the field insulating region; and, for a given value of the minimum thickness of the base region in a direction generally perpendicular to the semiconductor body's surface,
   the minimum thickness of the base region along the slanted wall of the field insulating region is greater than what would occur with the tilt angle at less than 15° during the introducing step.

6. A method as in claim 1 wherein the shield at least partially constitutes a photoresist mask having a mask edge that is situated along the semiconductor body's upper surface and locally controls where the dopant enters the semiconductor body.

7. A method as in claim 1 wherein the ion implanting step is initiated before initiating the providing step.

8. A method as in claim 1 wherein the ion implanting step is initiated after initiating the providing step.

9. A transistor fabrication method comprising the steps of introducing first and second semiconductor dopants of opposite conductivity type into a semiconductor body through at least partially overlapping portions of its upper surface to respectively define first and second regions that (1) are of opposite conductivity type and (2) abut a slanted wall of an electrically insulating field region at least partially sunk into the semiconductor body along its upper surface, the first region (a1) forming a first PN junction with, and separating the second region from, adjoining material of the semiconductor body outside the two regions, (a2) meeting the second region to form a second PN junction, and (a3) being a base region of a bipolar transistor, the second region (b1) extending to the semiconductor body's upper surface and (b2) being an emitter region of the transistor, wherein:
   the step of introducing the first dopant entails ion implanting the first dopant into the semiconductor body at a tilt angle of at least 15° relative to a direction generally perpendicular to the semiconductor body's upper surface using a shield to control where the first dopant enters the semiconductor body; and
   the step of introducing the second dopant entails forming the emitter region in material of the semiconductor body situated above part of the base region.

10. A method as in claim 9 wherein the step of introducing the first dopant includes annealing the semiconductor body subsequent to ion implanting the first dopant.

11. A method as in claim 9 wherein, for a given value of the minimum thickness $t_{BV}$ of the base region in a direction generally perpendicular to the semiconductor body's upper surface, the minimum thickness $t_{BL}$ of the base region along the semiconductor body's upper surface is greater than what would occur with the tilt angle at less than 15°.

12. A method as in claim 11 wherein:
   the tilt angle is sufficiently large that $t_{BL}$ is greater than $t_{BV}$; and
   $t_{BL}$ would be less than $t_{BV}$ at a zero value of the tilt angle.

13. A method as in claim 11 wherein $t_{BL}$ generally increases with increasing tilt angle whereas $t_{BV}$ generally decreases with increasing tilt angle.

14. A method as in claim 9 wherein, for a given value of the minimum thickness $t_{BV}$ of the base region in a direction generally perpendicular to the semiconductor body's upper surface, the minimum thickness $t_{BW}$ of the base region along the slanted wall of the field insulating region is greater than what would occur with the tilt angle at less than 15°.

15. A method as in claim 14 wherein:
   the tilt angle is sufficiently large that $t_{BW}$ is greater than $t_{BV}$; and
   $t_{BW}$ would be less than $t_{BV}$ at a zero value of the tilt angle.

16. A method as in claim 14 wherein $t_{BW}$ generally increases with increasing tilt angle whereas $t_{BW}$ generally decreases with increasing tilt angle.

17. A method as in claim 9 wherein the shield includes part of the field insulating region.

18. A method as in claim 9 wherein the shield at least partially constitutes a photoresist mask having a mask edge that is situated along the semiconductor body's upper surface and locally controls where the first dopant enters the semiconductor body.

19. A transistor fabrication method comprising the steps of:
   providing an emitter region of a bipolar transistor in material of a semiconductor body along its upper surface; and
   subsequently introducing semiconductor dopant into the semiconductor body through its upper surface to form a base region that (1) surrounds the emitter region within material of the semiconductor body and (2) forms a PN junction with adjoining material of the semiconductor body outside the base region, the introducing step entailing ion implanting the dopant into the semiconductor body at a tilt angle of at least 15° relative to a direction generally perpendicular to the semiconductor body's upper surface using a shield to control where the dopant enters the semiconductor body.

20. A method as in claim 19 wherein the shield at least partially constitutes a photoresist mask having a mask edge that is situated along the semiconductor body's upper surface and locally controls where the dopant enters the semiconductor body.

21. A method comprising the following steps for fabricating a bipolar transistor:

introducing semiconductor dopant of a first conductivity type into a semiconductor body through a specified portion of its upper surface to form an emitter region that extends to the semiconductor body's upper surface; and subsequently introducing semiconductor dopant of a second conductivity type opposite to the first conductivity type into the semiconductor body through at least part of the specified portion of the semiconductor body's upper surface to form a base region that (1) surrounds the emitter region within material of the semiconductor body and (2) forms a PN junction with material of the semiconductor body outside the base region, the dopant of the second conductivity type being ion implanted at a tilt angle of at least 15° relative to a direction generally perpendicular to the semiconductor body's upper surface using a shield to control where the dopant of the second conductivity type enters the semiconductor body.

22. A method as in claim 21 wherein the shield at least partially constitutes a photoresist mask having a mask edge that is situated along the semiconductor body's upper surface and locally controls where the dopant of the second conductivity type enters the semiconductor body.

23. A transistor fabrication method comprising the steps of:

introducing semiconductor dopant into a semiconductor body through part of its upper surface to define a doped zone that forms a PN junction with adjoining material of the semiconductor body outside the doped zone, a portion of the doped zone constituting a base region for a bipolar transistor, the introducing step entailing ion implanting the dopant into the semiconductor body at a tilt angle of at least 15° relative to a direction generally perpendicular to the semiconductor body's upper surface using a shield comprising a photoresist mask that has a mask edge provided along the semiconductor body's upper surface for locally controlling where at least part of the dopant enters the semiconductor body; and providing an emitter region for the transistor in material of the semiconductor body situated above part of the base region.

24. A method as in claim 23 wherein the introducing step is initiated before the providing step.

25. A transistor fabrication method comprising the steps of introducing first and second semiconductor dopants of opposite conductivity type into a semiconductor body through at least partially overlapping portions of its upper surface to respectively define first and second regions of opposite conductivity type, the first region (a1) forming a first PN junction with, and separating the second region from, adjoining material of the semiconductor body outside the two regions, (a2) meeting the second region to form a second PN junction, and (a3) being a base region of a bipolar transistor, the second region (b1) extending to the semiconductor body's upper surface and (b2) being an emitter region of the transistor, wherein:

the step of introducing the first dopant entails ion implanting the first dopant into the semiconductor body at a tilt angle of at least 15° relative to a direction generally perpendicular to the semiconductor body's upper surface using a shield comprising a photoresist mask that has a mask edge provided along the semiconductor body's upper surface for locally controlling where at least part of the first dopant enters the semiconductor body; and the step of introducing the second dopant entails forming the emitter region in material of the semiconductor body situated above part of the base region.

26. A method as in claim 25 wherein the first and second regions are laterally surrounded by an electrically insulating field region at least partially sunk into the semiconductor body along its upper surface, the shield including part of the field insulating region.

* * * * *